US006476591B2

(12) United States Patent
Yamaguchi et al.

(10) Patent No.: US 6,476,591 B2

(45) Date of Patent: Nov. 5, 2002

(54) POWER SUPPLY DEVICE FOR DRIVING LIQUID CRYSTAL, LIQUID CRYSTAL DEVICE AND ELECTRONIC EQUIPMENT USING THE SAME

(75) Inventors: Hisashi Yamaguchi, Akaskina-machi (JP); Tadashi Yasue, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/977,941

(22) Filed: Oct. 17, 2001

(65) Prior Publication Data

US 2002/0017932 A1 Feb. 14, 2002

Related U.S. Application Data

(63) Continuation of application No. 09/623,197, filed as application No. PCT/JP00/00038 on Jan. 7, 2000, now Pat. No. 6,342,782.

(51) Int. Cl.$^{7}$ .............................. H03H 1/06; G09G 3/36

(52) U.S. Cl. .......................... 323/369; 345/211; 345/95

(58) Field of Search ................................. 323/369, 320, 323/319, 318; 345/90, 87, 88, 95, 98, 210, 211

(56) References Cited

U.S. PATENT DOCUMENTS 5,404,150 A 4/1995 Murata
5,627,457 A 5/1997 Ishiyama et al.
5,675,352 A 10/1997 Rich et al.

FOREIGN PATENT DOCUMENTS

JP 56-65190 6/1981
JP 56-115176 9/1981
JP 6-214527 8/1994
JP 6-324640 11/1994
JP 7-98577 4/1995
JP 9-43568 2/1997

*Primary Examiner*—Rajnikant B. Patel
(74) *Attorney, Agent, or Firm*—Oliff & Berridge PLC

(57) ABSTRACT

A power supply device for driving liquid crystal which generates four liquid crystal drive voltages V1 and V4 between first and second reference voltages, the power supply device comprising: a voltage division circuit 102 which divides a voltage between voltages between voltages V1 and V5 and generates four pairs of first voltages NV1 to NV4 and second voltages PV1 to PV4; and four impedance conversion circuits 103 and 104 which generate impedance converted liquid crystal drive voltages V1 to V4 based on the four pairs of the first and second voltages. Each impedance conversion circuit comprises voltage follower type of differential amplifier circuits 120 and 110 to which a pair of the first and second voltages is input, and an output circuit 130 which is driven by the differential amplification circuits. The N-type transistor 134 and P-type transistor 132 in the output circuit are independently driven by the first and second output voltages VN, VP from the differential amplification circuits 120 and 110.

12 Claims, 16 Drawing Sheets

POWER SUPPLY DEVICE FOR DRIVING LIQUID CRYSTAL, LIQUID CRYSTAL DEVICE AND ELECTRONIC EQUIPMENT USING THE SAME

This is a Continuation of application Ser. No. 09/623,197 filed Oct. 13, 2000, which in turn is a U.S. National Stage of PCT/JP00/00038 filed Jan. 7, 2000. The entire disclosure of the prior application(s) is hereby incorporated by reference herein in its entirety.

TECHNICAL FIELD

The present invention relates to a power supply device for driving liquid crystal, together with a liquid crystal device and electronic equipment which use that power supply device.

BACKGROUND ART

Conventional methods of reducing the required current for a power supply device which is used for driving liquid crystal have been disclosed in Japanese Patent Applications Laid-open No. 6-324640, No. 7-98577, No. 9-43568, and the like. An example of a conventional power supply device for driving liquid crystal is shown FIG. 7.

A power supply device for driving liquid crystal 701 shown in FIG. 7 has a voltage division circuit 702, two first impedance conversion circuits 703, and two second impedance conversion circuits 704.

The voltage division circuit 702 contains resistors 706 to 710 and generates voltages V1 to V4 by dividing a voltage between a source voltage VDD and a reference voltage for driving liquid crystal VLCD.

When the source voltage VDD is a voltage V0 and the reference voltage for driving liquid crystal VLCD is a voltage V5, voltages V0 to V5 correspond to voltage levels in the driving waveform for scan electrodes (or common electrodes) COM0, COM1, and COMX shown in FIG. 13 and also for signal electrodes (or segment electrodes) SEG1 to SEG4 shown in FIG. 14.

The first impedance conversion circuit 703 is formed by voltage follower connection of an operational amplifier consisting of a constant current circuit 801, P-type differential amplification circuit 802, and output circuit 803 as shown in FIG. 8. An N-type transistor 805 in the output circuit 803 forms a current source by receiving a constant bias voltage from the constant current circuit 801, thereby providing a load for the P-type transistor 804.

The characteristics of the first impedance conversion circuits 703 which generate the voltages V1 and V3 are determined by taking into account the direction of movement of electric charges in the scan electrodes (or common electrodes) or the signal electrodes (or segment electrodes) to which the voltage V1 or V2 is applied. Specifically, as indicated by 1102 in FIGS. 13 and 14, positive charges to be moved from the first impedance conversion circuits 703 to the electrodes is larger in amount than negative charges. For this reason, a P-type transistor 804 which causes a current to flow into the electrodes is used as an active element in the first impedance conversion circuits 703.

The second impedance conversion circuit 704 is formed by voltage follower connection of an operational amplifier consisting of a constant current circuit 901, N-type differential amplification circuit 902, and output circuit 903 as shown in FIG. 9. A P-type transistor 904 in the output circuit 903 forms a current source by receiving a constant bias voltage from the constant current circuit 901, thereby providing a load for the N-type transistor 905.

The characteristics of the second impedance conversion circuits 704 which generate the voltages V2 and V4 are also determined by taking into account the direction of movement of electric charges in the scan electrodes (or common electrodes) or the signal electrodes (or segment electrodes) to which the voltage V2 or V4 is supplied. Specifically, as indicated by 1201 in FIGS. 13 and 14, negative charges to be moved from the second impedance conversion circuits 704 to the electrodes is larger in amount than positive charges. For this reason, an N-type transistor 905 which causes a current to be drawn from the electrodes is used as an active element in the second impedance conversion circuits 704.

Among the divided voltages V1 to V4 in the voltage division circuit 702, the voltages V1 and V3 are repectively input to the plus terminals of the first impedance conversion circuits 703, and the voltages V2 and V4 are respectively input to the plus terminals of the second impedance conversion circuits 704. The impedance conversion of the voltages V1 to V4 can be carried out in this manner, thereby generating voltages for driving liquid crystal V1 to V4.

Conventional power supply devices for driving liquid crystal use an active load for the output circuit of an impedance conversion circuit to reduce current flowing through loading transistors, thereby reducing required current flowing through the impedance conversion circuit.

For maintaining display quality while limiting the amount of current flowing in the loading transistors through the impedance conversion circuits, the above-described load current must be supplemented. For this reason, it has been required to provide a capacitor element 705 between the output line for each of the voltages V1 to V4 and the output line for the voltage V0 (VDD), as shown in FIG. 7. The above load current can be supplemented by discharging the charges from the capacitor element 705.

However, the capacitor element 705 has to be provided outside the power supply device for driving liquid crystal, because the capacitor element 705 has a large volume.

Downsizing and cost reduction are strongly demanded factors for electronic equipment, particularly for portable electronic equipment having a built-in liquid crystal device, so that the display quality is required to be maintained while reducing the number of parts such as capacitor elements.

The present invention has been devised to solve the above problems and has as an objective therof the provision of a power supply device for driving liquid crystal which enables low current comsumption, together with a liquid crystal device and electronic equipment using such a power supply device.

Another objective of the present invention is to provide a power supply device for driving liquid crystal which enables to omit parts such as a capacitor element while maintaining display quality, together with a liquid crystal device and electronic equipment using such a power supply device.

DISCLOSURE OF THE INVENTION

The power supply device for driving liquid crystal of the present invention which generates N numbers of liquid crystal drive voltages between first and second reference voltages, comprises: a voltage division circuit which divides a voltage between the first and second reference voltages to generate N pairs of first and second voltages comprising N numbers of first voltages each of which is equal to or higher than each of the N numbers of liquid crystal drive voltages, and N numbers of second voltages each of which is equal to or lower than each of N numbers of liquid crystal drive voltages, when the first voltage is not equal to the second voltage in each pair; and N numbers of impedance conversion circuits which generate N numbers of impedance transformed liquid crystal drive voltages based on the N pairs of the first and second voltages.

Each of the N numbers of impedance conversion circuits comprises: a voltage follower type of differential amplification circuit to which a pair of the first and second voltages among the N pairs of the first and second voltages is input; and an output circuit including a P-type transistor and N-type transistor connected in series between a first power supply line for the first reference voltage and a second power supply line for the second reference voltage, and having an output terminal which is connected between the P-type transistor and N-type transistor and outputs one of the N numbers of liquid crystal drive voltages.

On-and-off operation of the N-type transistor is controlled by the first output voltage from the differential amplification circuit, and on-and-off operation of the P-type transistor is controlled by the second output voltage from the differential amplification circuit.

In each impedance conversion circuit according to the present invention, a first and a second output voltage, each differing from the other, are output from a voltage follower type of differential amplification circuit to which a first and a second voltage, each differing from the other, are input. In each impedance conversion circuit, the voltage for driving liquid crystal is generated by independently controlling the on-and-off operation of the P-type and N-type transistors of the output circuit by the first and second output voltages.

The differential amplification circuit may turn on the N-type transistor when an output voltage of the output terminal is higher than the first voltage, turn on the P-type transistor when an output voltage of the output terminal is lower than the second voltage, and turn off both the P-type and N-type transistors when an output voltage of the output terminal is between the first and second voltages. This operational mode prevents both the P-type and N-type transistors from being turned on at the same time, thereby preventing a short circuit current from flowing via the P-type and N-type transistors and reducing current consumption.

Current drive capabilities of the P-type and N-type transistors of the output circuit may be substantially equivalent. This enables the voltage to promptly converge to the liquid crystal drive voltage irrespective of polarity (positive or negative) of the charge to be transferred from the electrodes of a liquid crystal panel to be driven to the impedance conversion circuit. In addition, a sufficient quantity of load current can be secured even if no capacitor elements are connected. Furthermore, when an overload in the reverse direction is applied by surge or the like, a required amount of charge can be immediately supplied by the N-type or P-type transistor, whereby anti-noise properties can be improved, resulting in high display performance.

A potential difference between voltages of a pair of the first and second voltages may be variable in the voltage division circuit. Variation in the characteristics of the differential amplifier, particularly variation in the offset voltage between the input and output voltages can be controlled in this manner.

A potential difference between voltages of a pair of the first and second voltages may be larger than the absolute value of an offset voltage between input and output voltages of the differential amplification circuit. Otherwise a potential difference might not be created between the first and second voltages, even if the first and second voltages are different.

The differential amplification circuit may comprise: an N-type voltage follower differential amplification circuit which receives the first voltage and applies the first output voltage to a gate of the N-type transistor; and a P-type voltage follower differential amplification circuit which receives the second voltage and applies the second output voltage to a gate of the P-type transistor.

In this case, a potential difference between voltages of a pair of the first and second voltages may be larger than the sum of the absolute value of a first offset voltage between input and output voltages of the N-type differential amplification circuit and the absolute value of a second offset voltage between input and output voltages of the P-type differential amplification circuit. The potential difference between the first and second output voltages can be ensured in this manner.

At least one of the N impedance conversion circuits may be connected between the output terminal and the second power supply line in parallel with the N-type transistor, and may further comprise an N-type transistor for a constant current having a gate to which a constant bias voltage is applied.

This configuration is effective when negative charges to be transferred from the electrodes for driving liquid crystal to the impedance conversion circuit is larger than positive charges to be transferred in a similar way. It is because negative charges can be drawn by driving the N-type transistor for a constant current.

At least another one of the N impedance conversion circuits may be connected between the first power supply line and the output terminal in parallel with the P-type transistor, and may further comprise another P-type transistor for a constant current having a gate to which a constant bias voltage is applied.

This configuration brings about a greater advantage when positive charges to be transferred from the electrodes for driving liquid crystal to the impedance conversion circuit is larger than negative charges to be transferred in a similar way. It is because positive charges can be drawn by driving the P-type transistor for a constant current.

At least one of the N numbers of impedance conversion circuits may have the first voltage among a pair of the first and second voltages set substantially equivalent to one of the N numbers of liquid crystal drive voltages.

In this manner, the voltage can converge relatively promptly to the inherent voltage for driving liquid crystal, even if a voltage lower than the liquid crystal drive voltage is applied to the output terminal of the impedance conversion circuit while the liquid crystals are driven.

At least another one of the N numbers of impedance conversion circuits may have the second voltage among a pair of the first and second voltages set substantially equivalent to another one of the N numbers of liquid crystal drive voltages.

In this manner, the voltage can converge relatively promptly to the inherent voltage for driving liquid crystal, even if a voltage higher than the liquid crystal drive voltage is applied to the output terminal of the impedance conversion circuit while the liquid crystals are driven.

A liquid crystal device of the present invention comprises: the above-described power supply circuit for driving liquid crystal; a liquid crystal panel in which scanning electrodes and signal electrodes are formed; a scanning electrode drive circuit which drives the scanning electrodes based on power supply from the power supply circuit for driving liquid crystal; and a signal electrode drive circuit which drives the signal electrodes based on the power supply from the power supply circuit for driving liquid crystal.

Electronic equipment of the present invention comprises the above-mentioned liquid crystal device.

The liquid crystal device and electronic equipment of the present invention are particularly useful for a portable electronic instrument having a liquid crystal device, because of a low current consumption due to prevention of short circuit current from flowing and miniaturization due to elimination of installed parts such as a capacitor element.

BEST MODE FOR CARRYING OUT THE INVENTION

An embodiment of the present invention will be explained with reference to the drawings.

(Description of Power Supply Device for Driving Liquid Crystal)

Figure 1:
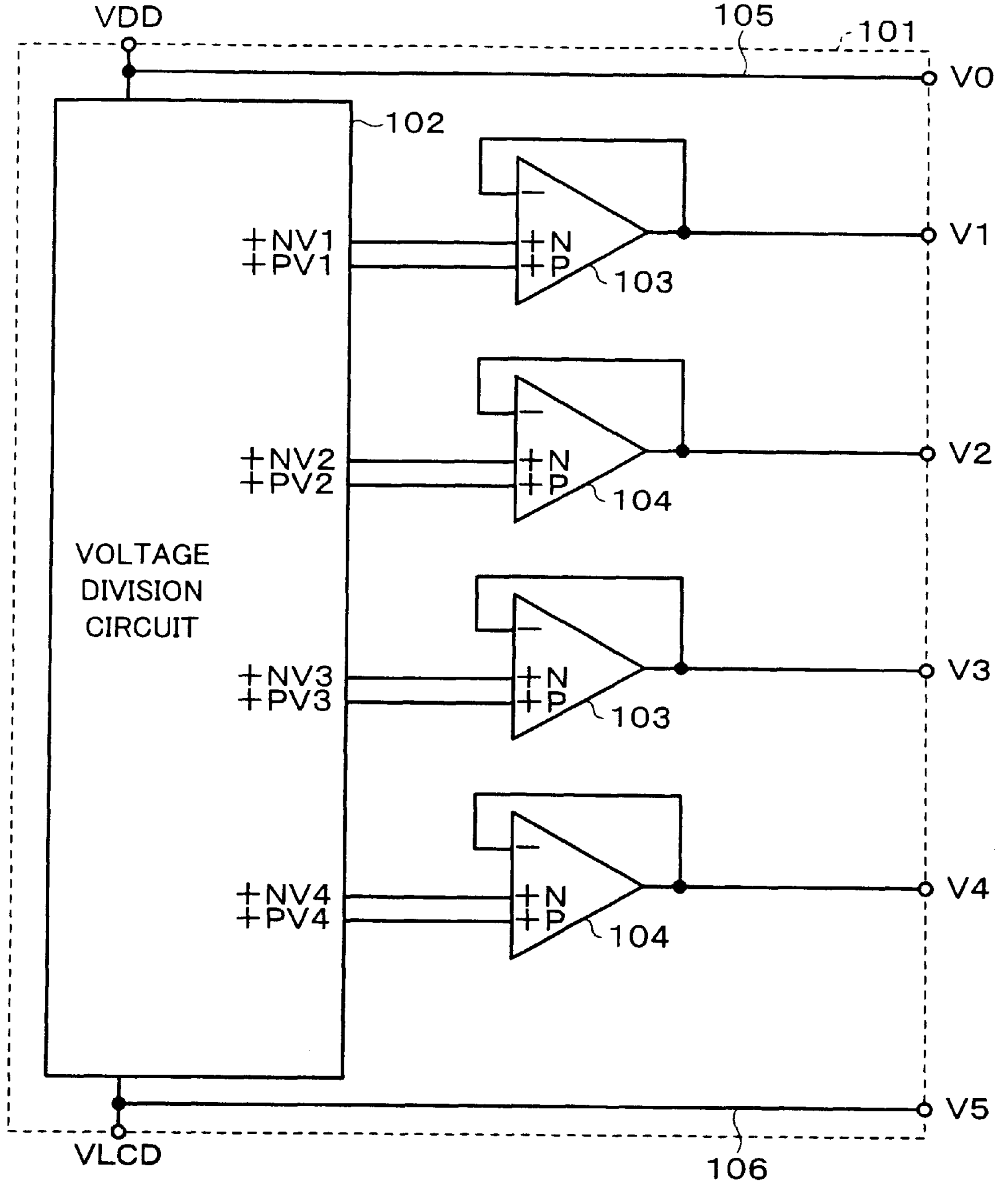
FIG. 1 is a circuit diagram of a power supply device for driving liquid crystal according to an embodiment of the present invention.

A circuit diagram of a power supply device for driving liquid crystal in accordance with the embodiment of the present invention is shown in FIG. 1. The power supply device for driving liquid crystal 101 shown in FIG. 1 principally has a voltage division circuit 102, two first impedance conversion circuits 103, and two second impedance conversion circuits 104.

Figure 15:
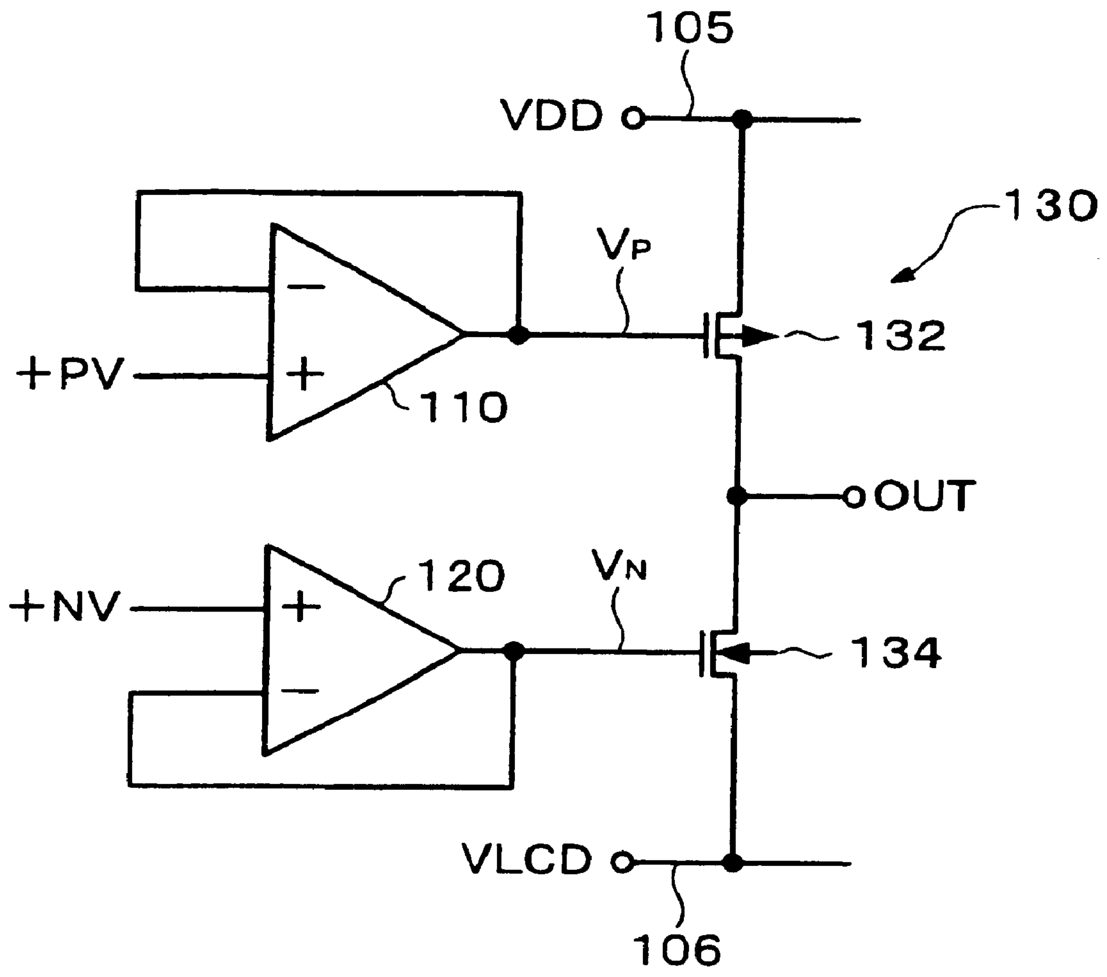
FIG. 15 is a circuit diagram showing a basic configuration of the first and second impedance conversion circuits of FIG. 1.

Each of the first and second impedance conversion circuits 103 and 104 basically has a P-type differential amplification circuit 110, N-type differential amplification circuit 120, and an output circuit 130 which is driven by these amplifiers, as shown in FIG. 15. Each of the first and second impedance conversion circuits 103, 104 is formed by the voltage follower connection of the minus input terminal and the output terminal respectively of the P-type differential amplification circuit 110 and the N-type differential amplification circuit 120. Voltage (+PV) and voltage (+NV) are independently input to the plus input terminal of the P-type differential amplification circuit and the plus input terminal of N-type differential amplification circuit, respectively. The output circuit 130 has a P-type transistor 132 and N-type transistor 134 which are connected in series between a first power supply line 105 for supplying a source voltage VDD and a second power supply line 106 for supplying a reference voltage for driving liquid crystal VLCD. An output terminal OUT is connected to the line between the P-type transistor 132 and N-type transistor 134. The output voltage of the P-type differential amplification circuit 110 is applied to the gate of the P-type transistor 132, and the output voltage of the N-type differential amplification circuit 120 is applied to the gate of the N-type transistor 134.

In the voltage division circuit 102, the source voltage VDD (voltage V0) is supplied to the high voltage side and the reference voltage for driving liquid crystal VLCD (voltage V5) is supplied to the low voltage side. Four (N=4) first voltages (+NV1) to (+NV4) and four (N=4) second voltages (+PV1) to (+PV4) are then divisionally generated between the voltages V0 and V5. For instance, a first voltage (+NV1) and a second voltage (+PV1) form a pair of first and second voltages. Therefore, four (N=4) pairs of first and second voltages are generated in the voltage division circuit 102.

A pair of the first and second voltages(+NV1) and (+PV1) are respectively supplied to the +N input terminal and +P input terminal of the first impedance conversion circuit 103 which generates the voltage V1. Another pair of the first and second voltages(+NV2) and (+PV2) is respectively supplied to the +N input terminal and +P input terminal of the second impedance conversion circuit 104 which generates the voltage V2. Further pair of first and second voltages(+NV3) and (+PV3) is respectively supplied to the +N input terminal and +P input terminal of the first impedance conversion circuit 103 which generates the voltage V3. Still further pair of first and second voltages(+NV4) and (+PV4) is respectively supplied to the +N input terminal and +P input terminal of the second impedance conversion circuit 104 which generates the voltage V4. Impedance conversion of the output voltage of the voltage division circuit 102 is performed in this manner and the voltages V1 to V4 are generated.

The potential relationship among the voltages VDD, (+NV1) to (+NV4), (+PV1) to (+PV4), and VLCD is shown by the following expression (1).

$$VDD>(+NV1)>(+PV1)>(+NV2)>(+PV2)>(+NV3)>(+PV3)>(+NV4)>(+PV4)>VLCD \quad (1)$$

Next, potential difference in each pair of first and second voltages will be described. The objective of providing a potential difference between a pair of first and second voltages is to prevent the maximum short circuit current from flowing between the first and second power supply line 105 and 106 via the P-type and N-type transistors 132 and 134 in the output circuit 130 of FIG. 15 by preventing simultaneous turn-on of the P-type and N-type transistors 132 and 134, in order to reduce the electric consumption.

Figure 16:
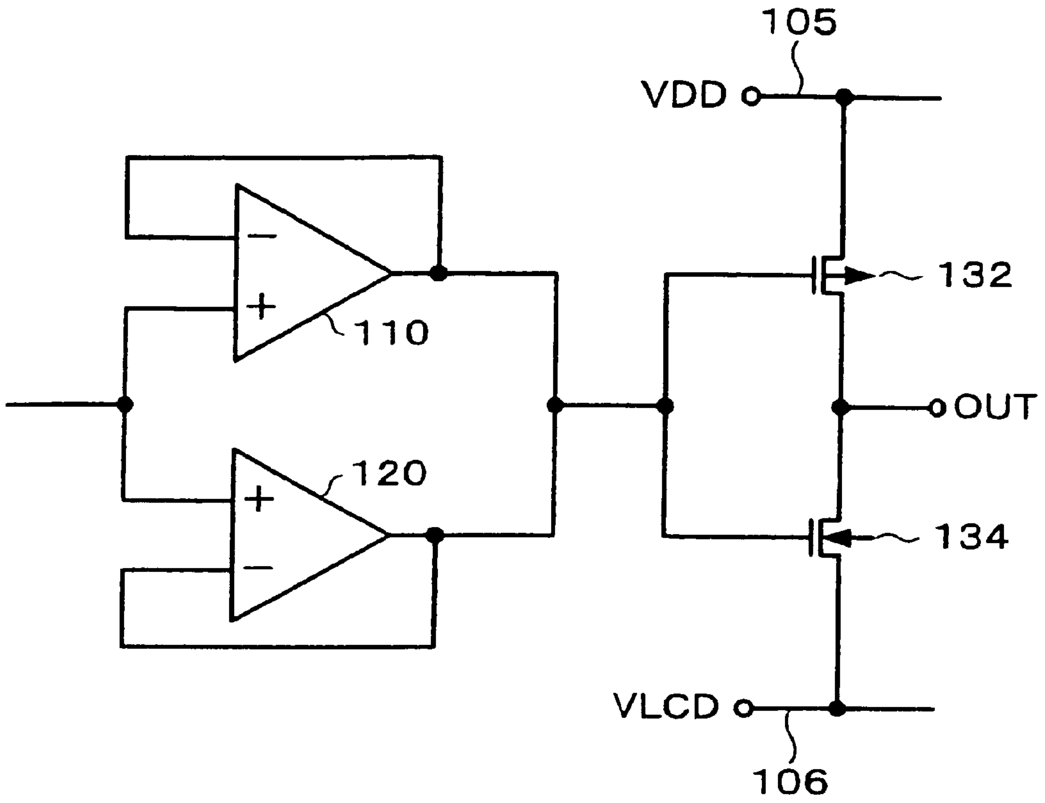
FIG. 16 is a circuit diagram showing a modification of the impedance conversion circuit of FIG. 15 having the same voltage as the first and second voltages.

An equivalent circuit which is specially configured such that the output of the P-type differential amplification circuit 110 and the output of the N-type differential amplification circuit 120 have the same voltage is shown in FIG. 16. Specifically, the voltages of a pair of first and second voltages to be input to the impedance conversion circuit of FIG. 16 are the same. In this case, the output of the P-type differential amplification circuit 110 and the output of the N-type differential amplification circuit 120 are shorted out, and the P-type and N-type transistors 132 and 134 are driven by the same shorted-out voltage.

Figure 17:
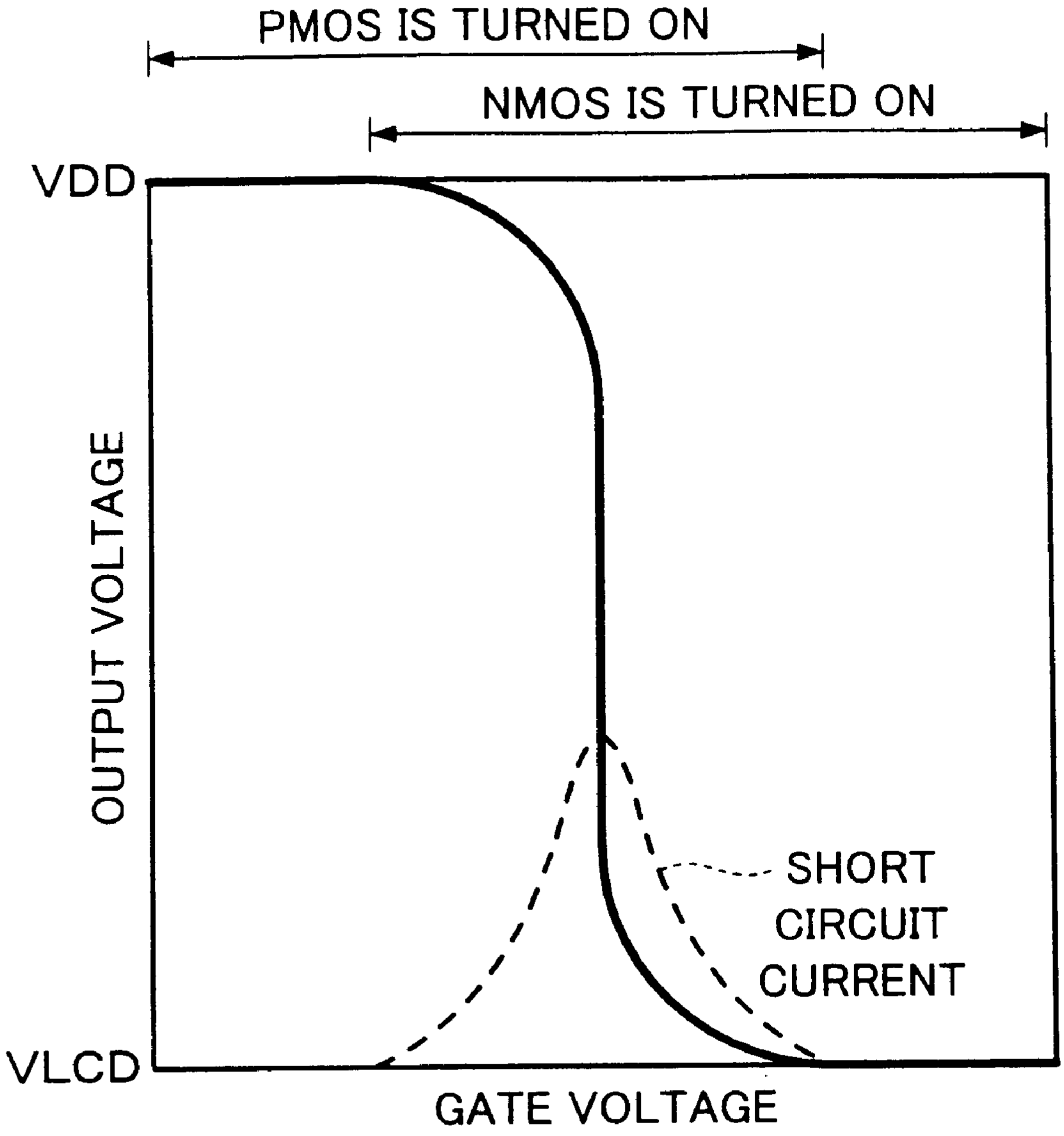
FIG. 17 is a characteristic chart showing the characteristics of a CMOS inverter .

In this time, the P-type and N-type transistors 132 and 134 of FIG. 16 have the same characteristics as a known CMOS transistor and exhibit the on-and-off characteristics as shown in FIG. 17. According to the characteristics of a CMOS transistor, if the common voltage applied to the gates of the P-type and N-type transistors 132 and 134 is in a given range, the P-type and N-type transistors 132 and 134 are simultaneously turned on and a maximum short circuit current will flow. The objective of the present embodiment is to prevent the flowing of a maximum short circuit current.

In order to prevent simultaneous turn-on of the P-type and N-type transistors 132 and 134 and flowing of a maximum short circuit current, voltages of a pair of the first and second voltages to be input to the impedance conversion circuit should be made different, thereby applying different voltages to the P-type and N-type transistors 132 and 134. This can be achieved by providing an electric potential difference to a pair of first and second voltages to be input to the plus input terminals of the N-type and P-type differential amplification circuits 110 and 120. The reason is that both the P-type and N-type differential amplification circuits 110 and 120 are of a voltage follower type, in which the same voltage as the voltage input to the plus input terminal is available as the output voltage.

In the P-type and N-type differential amplification circuits 110 and 120, an output voltage is not necessarily equivalent to an input voltage. Such a difference is called an offset voltage of a differential amplification circuit (VOFFSET).

It is assumed that the absolute value of the first offset voltage that is a difference between input and output voltages of the N-type differential amplification circuit 110 is represented by |VOFFSETN|, and the absolute value of the second offset voltage that is a difference between input and output voltages of the P-type differential amplification circuit 110 is represented by |VOFFSETP| in the impedance conversion circuit of FIG. 15. The first and second offset voltages is either positive or negative, and absolute values of the offset voltages are defined as follows taking the worst case into account.

Taking the first impedance conversion circuit 103 which generates the voltage V1 of FIG. 1 as an example, the worst case, in which the potential difference (VN-VP) between the first output voltage VN in the N-type differential amplification circuit 120 to which the first voltage NV is input and the second output voltage VP in the P-type differential amplification circuit 110 to which the second voltage PV is input is zero, will be the following. That is the case where the first output voltage VN of the N-type differential amplification circuit 120 to which the voltage NV1 is input is NV1−|VOFFSETN|, and the second output voltage VP of the P-type differential amplification circuit 110 to which the voltage PV1 is input is PV1+|VOFFSETP|.

In this case, if the relationship VN−VP=NV1−|VOFFSETN|−(PV1+|VOFFSETP|)>0 is not satisfied, there is a fear that the P-type and N-type transistors 132 and 134 in the output circuit 130 of FIG. 15 forming the first impedance conversion circuit 103 may be simultaneously turned on.

Presuming that the equation |VOFFSETN|+|VOFFSETP|=VOFFSET is satisfied, the conditions under which a short circuit current does not flow are shown by the following expression (2).

$$\mathrm{VOFFSET}<(+NV1)-(+PV1) \quad (2)$$

This can be also applied to the impedance conversion circuits 104 and 104 in FIG. 1. In this case, the following expressions must be satisfied.

$$\mathrm{VOFFSET}<(+NV2)-(+PV2) \quad (3)$$

$$\mathrm{VOFFSET}<(+NV3)-(+PV3) \quad (4)$$

$$\mathrm{VOFFSET}<(+NV4)-(+PV4) \quad (5)$$

Figure 18:
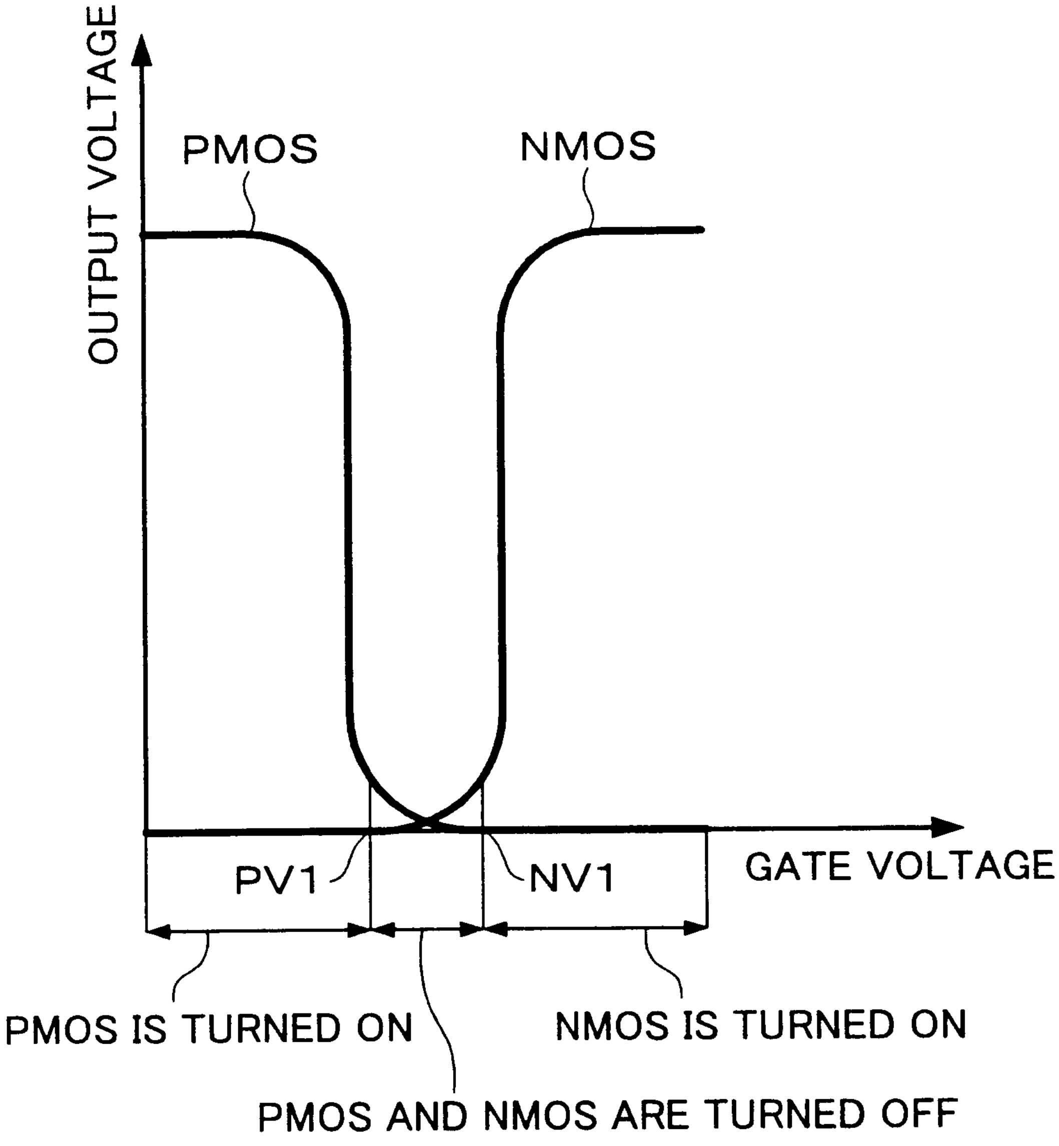
FIG. 18 is a characteristic chart showing an example of the ON-OFF characteristics of P-type and N-type transistors in the output circuit of the power supply device for driving liquid crystal in accordance with the embodiment of the present invention.

If the relationships of the expressions (2) to (5) are satisfied, it can be prevented that the P-type and N-type transistors 132 and 134 are simultaneously turned on to flow the maximum short circuit current, so that the amount of current consumption can be reduced. Specifically, the on-and-off characteristics of the P-type and N-type transistors 132 and 134 of this embodiment can be implemented as shown in FIG. 18.

The potential relationship among the voltages VDD, V1, V2, V3, V4, and VLCD is similar to that in general power supply for driving liquid crystal, ans is shown by the following expression (6).

$$\mathrm{VDD}=V0>V1>V2>V3>V4>V5=\mathrm{VCDL} \quad (6)$$

(Voltage Division Circuit)

Figure 2:
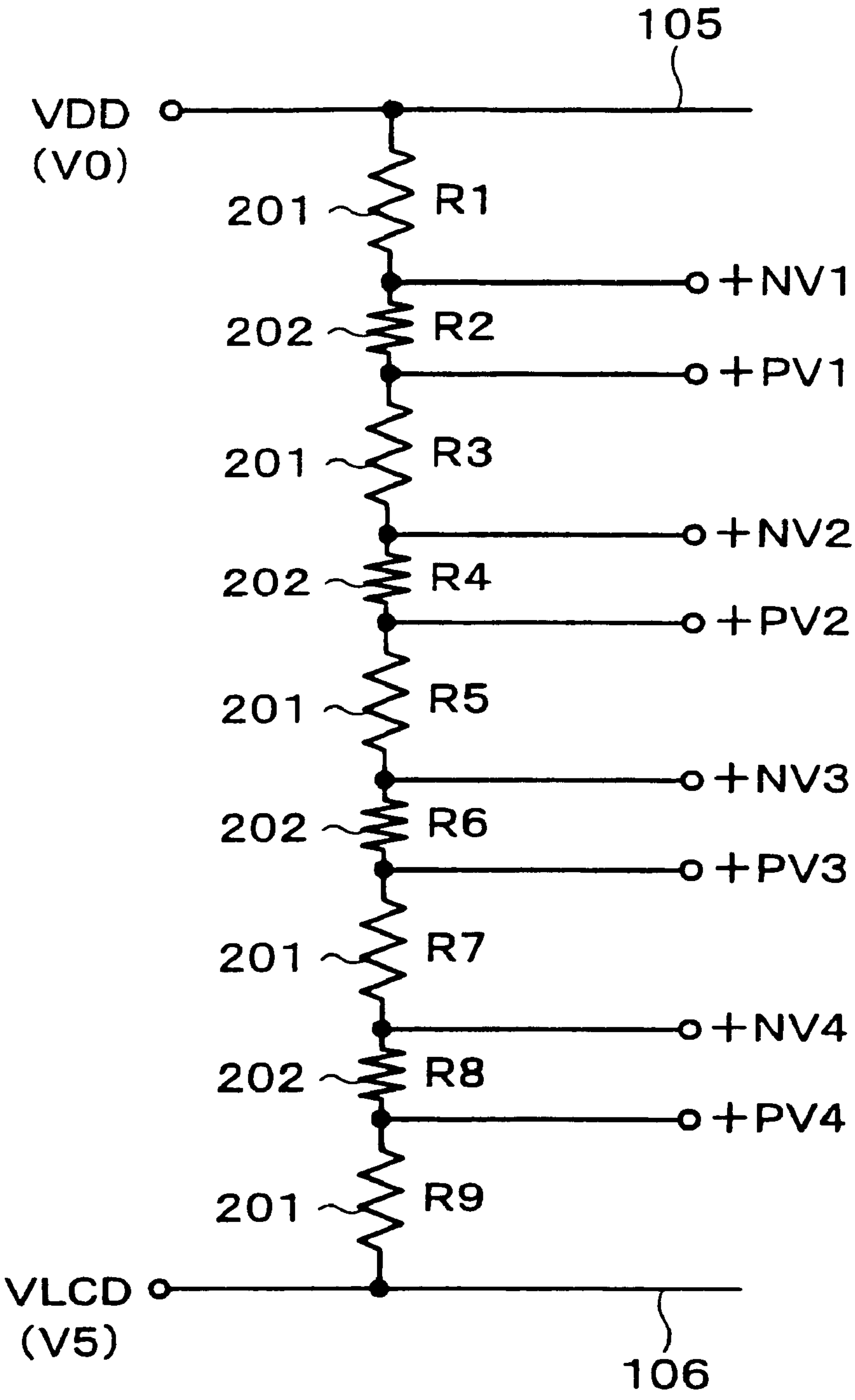
FIG. 2 is a circuit diagram of the voltage division circuit of FIG. 1 in which resistors are used.

An example of the voltage division circuit 102 of FIG. 1 is shown in FIG. 2. It comprises five first resistors 201 and four second resistors 202 alternately connected in series between the first power supply line 105 for the source voltage VDD (voltage V0) and the second power supply line 106 for the reference voltage for driving liquid crystal (voltage V5).

The resistances R2, R4, R6, and R8 of the four second resistors 202 are shown by the following expressions (7) and (8), wherein VOP is a voltage between VDD and VLCD, and Rt is the total of the resistances R1 to R9.

$$R2=R4=R6=R8=Ra \quad (7)$$

$$Ra=\mathrm{VOFFSET}/(VOP/Rt) \quad (8)$$

The resistances R1, R3, R5, R7 and R9 of the first resistors 201 divide and determine a voltage between the source voltage VDD and the reference voltage for driving liquid crystal VLCD according to the desired bias ratio of the voltage for driving liquid crystal. When the bias ratio of the voltage for driving liquid crystal is 1/5 and the voltages V1 to V4 are (+PV1) to (+PV4), for example, the resistances R1, R3, R5, R7 and R9 of the first resistors 201 are as shown by the following expressions (9) and (10).

$$R1=R3=R5=R7=Rt/5-Ra \quad (9)$$

$$R9=Rt/5 \quad (10)$$

Figure 3:
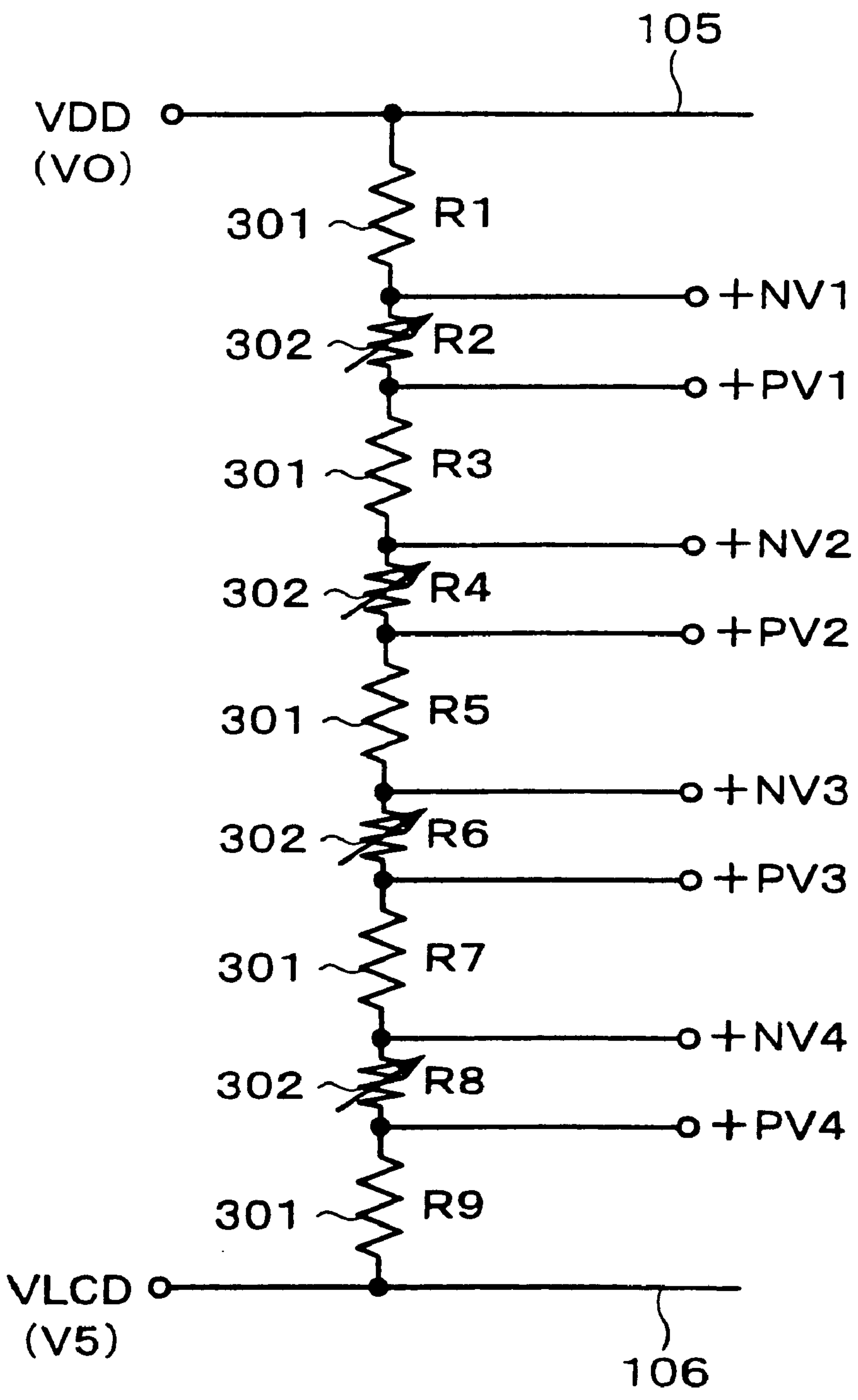
FIG. 3 is a circuit diagram of a modification of the voltage division circuit of FIG. 2, wherein the resistors are replaced by variable resistors.

Another example of the voltage division circuit 102 of FIG. 1, which comprises five resistors 301 and four variable resistors 302 alternately connected in series between the first and second power supply lines 105, 106, is shown in FIG. 3.

The resistances R1, R3, R5, R7 and R9 of the five resistors 301 are as shown in the expressions (9) and (10). If the resistances R2, R4, R6 and R8 of the four variable resistors 302 are variable, variations in the offset voltages due to variations of the semiconductor integrated circuits which occur during manufacture can be absorbed. In this case, resistances R2, R4, R6 and R8 after adjustment must satisfy the above described expression (7).

(Structure of the First and Second Impedance Conversion Circuits)

Figure 4:
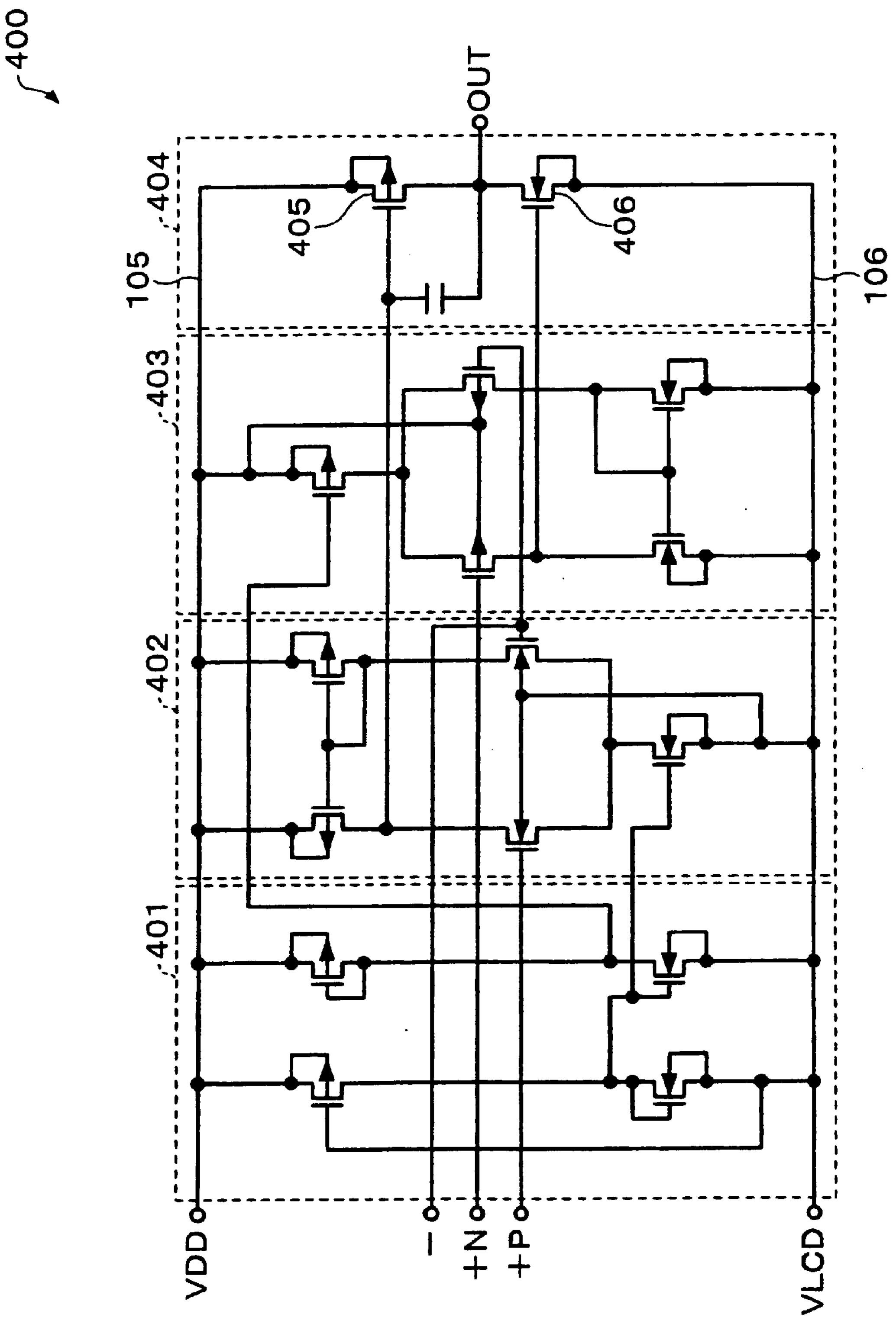
FIG. 4 is a circuit diagram showing an example of a circuit which is used in common by the first and second impedance conversion circuits of FIG. 1.

An example of the impedance conversion circuit 400 which is commonly used for the first impedance conversion circuit 103 and the second impedance conversion circuit 104 of FIG. 1 is shown in FIG. 4.

This impedance conversion circuit 400 has a constant current circuit 401, P-type differential amplification circuit 402, N-type differential amplification circuit 403, and output circuit 404. The output circuit 404 has a P-type transistor 405 and an N-type transistor 406 having a substantially equivalent current drive capability and connected in series between the first and second power supply lines 105 and 106, together with an output terminal OUT being connected between the transistors 405 and 406.

The minus input terminals of the P-type differential amplification circuit 402 and N-type differential amplification circuit 403 are connected to each other, and a pair of first and second voltages are independently applied to the plus input terminals (+N, +P) of these circuits.

The P-type transistor 405 of the output circuit 404 has a gate to which the output voltage of the P-type differential amplification circuit 402 is applied. The source voltage VDD is supplied to the source of the P-type transistor 405. The N-type transistor 406 of the output circuit 404 has a gate to which the output voltage of the N-type differential amplification circuit 403 is applied. The reference voltage for driving liquid crystal VLCD is supplied to the source of the N-type transistor 406. The drains of the P-type transistor 405 and N-type transistor 406 are connected and an output terminal OUT is connected to the connection.

The operation for impedance conversion of the voltage V1 in the impedance conversion circuit 400 of FIG. 4 will now be described referring to FIG. 10.

Figure 10:
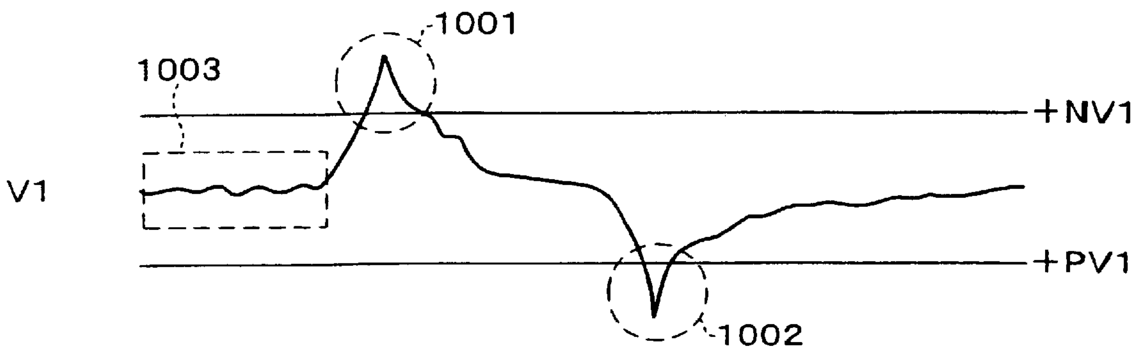
FIG. 10 is a waveform chart showing an output from the output terminal of the impedance conversion circuit of FIG. 4.

An output waveform from the output terminal OUT of the impedance conversion circuit 400 of FIG. 4 is shown in FIG. 10. In FIG. 10, 1001 shows an operating period of the N-type transistor 406, 1002 shows an operating period of the P-type transistor 405, and 1003 shows a non-operating period in which neither the P-type differential amplification circuit 402 nor the N-type differential amplification circuit 403 is actuated.

In the output circuit 404 of the FIG. 4, the output terminal "OUT" is connected by voltage follower connection as shown in FIG. 1, whereby the N-type differential amplification circuit 403 causes the N-type transistor 406 to be turned on at a voltage equal to or higher than the input voltage (+NV1) to the +N terminal, and the P-type differential amplification circuit causes the P-type transistor 405 to be turned on at a voltage equal to or lower than the input voltage (+PV1) to the +P terminal.

According to this basic operation, during the non-operating period 1003 in which neither the P-type transistor 405 nor the N-type transistor 406 is actuated (hereinafter called "off-period"), the voltage V1 between the voltage (+NV1) and voltage (+PV1) determined by the voltage follower connection appears at the output terminal OUT, so that the maximum short circuit current can be prevented from flowing through the output circuit 404.

The voltage at the output terminal OUT may increase from the voltage V1 to a level equal to or higher than the voltage (+NV1) due to potential fluctuation at an electrode on the side of a liquid crystal panel to be driven (see 1001 in FIG. 10). In this case, since the voltage at the minus input terminal of the impedance conversion circuit 400 increases, the output voltage of the N-type differential amplification circuit 403 also increases, and thus the N-type transistor 406 is turned on. As a result, the voltage at the output terminal OUT is decreased to a level equal to or lower than (+NV1) (the state of 1001 in FIG. 10).

When the voltage at the output terminal OUT becomes equal to the input voltage (+NV1) of the +N terminal, the N-type transistor 406 is turned off and the voltage converges to the voltage V1 between the voltages NV1 and PV1.

By contrast, there may be the occasion where the voltage at the output terminal OUT decreases to a level equal to or lower than the voltage (+PV1) due to potential fluctuation at an electrode on the side of a liquid crystal panel to be driven (see 1002 in FIG. 10). In this case, since the voltage at the minus input terminal of the impedance conversion circuit 400 also decreases, the output voltage of the P-type differential amplification circuit 402 also decreases, and thus the P-type transistor 407 is turned on. As a result, the voltage at the output terminal OUT is increased to a level equal to or higher than (+PV1) (the state of 1002 in FIG. 10).

When the voltage at the output terminal OUT becomes equal to the input voltage (+PV1) of the +P terminal, the P-type transistor 407 is turned off and the voltage converges to the voltage V1 between the voltages NV1 and PV1.

The basic operation mentioned above also applies to the case where the voltages V2 to V4 are generated. (Other examples of the first and second impedance conversion circuits)

Figure 5:
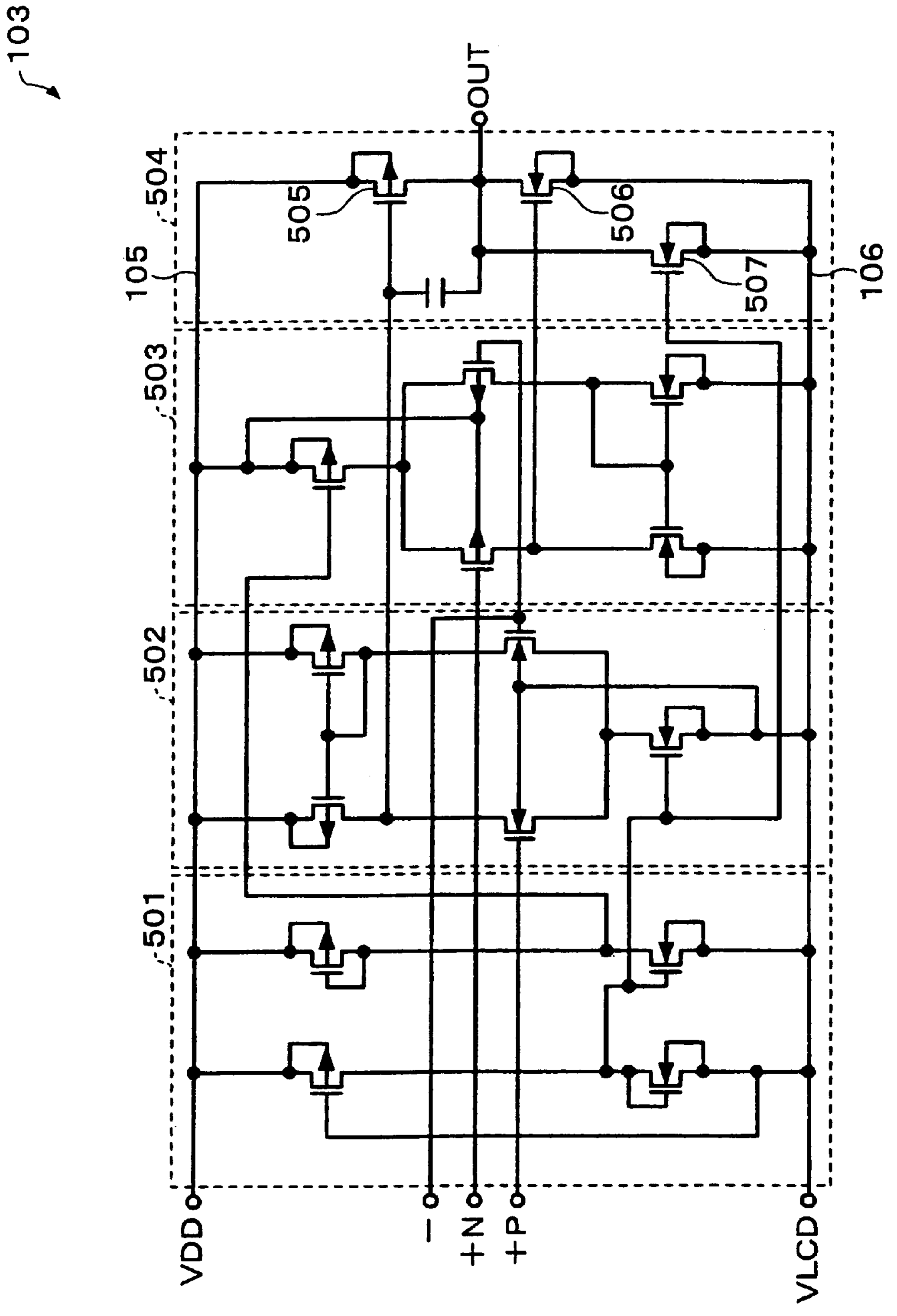
FIG. 5 is a circuit diagram showing another example of the first impedance conversion circuit of FIG. 1.

FIG. 5 is a circuit diagram showing another example of the first impedance conversion circuit 103 of FIG. 1. This first impedance conversion circuit 103 comprises a constant current circuit 501, P-type differential amplification circuit 502, N-type differential amplification circuit 503, and output circuit 504 similar to the impedance conversion circuit 400 of FIG. 4. Moreover, the output circuit 504 has the P-type transistor 505 and N-type transistor 506 similar to the impedance conversion circuit 400 of FIG. 4. The first impedance conversion circuit 103 differs from the circuit of FIG. 4 in that it has an N-type transistor 507 connected between the output terminal OUT and the second power supply line 106. The output voltage of the constant current circuit 501 is applied to the gate of the N-type transistor 507. Note that the N-type transistor 507 is designed so that a constant current is allowed to flow only in an amount as small as possible.

Figure 6:
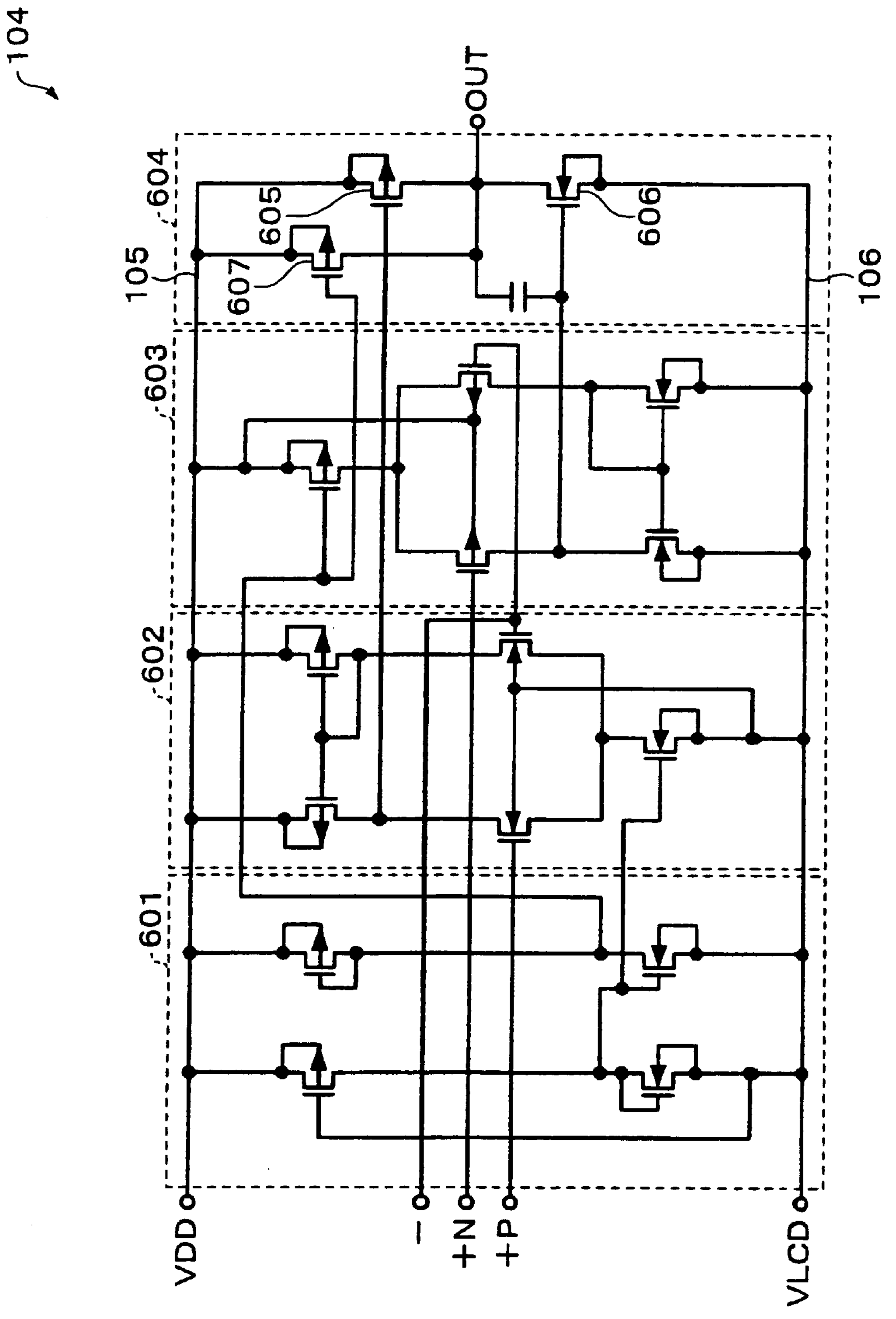
FIG. 6 is a circuit diagram showing another example of the second impedance conversion circuit of FIG. 1.
Figure 7:
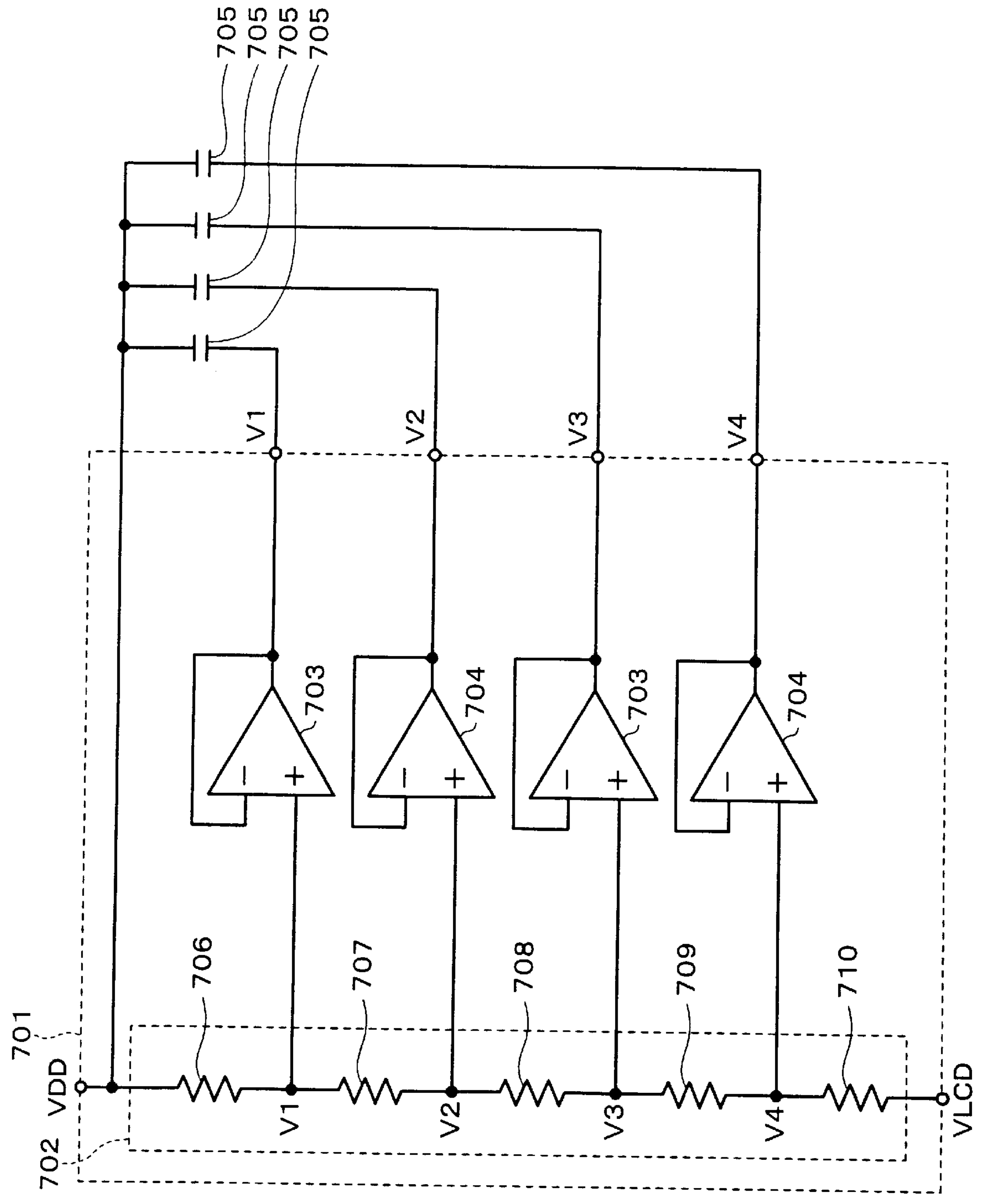
FIG. 7 PRIOR ART
FIG. 7 is a circuit diagram showing a conventional power supply device for driving liquid crystal.
Figure 8:
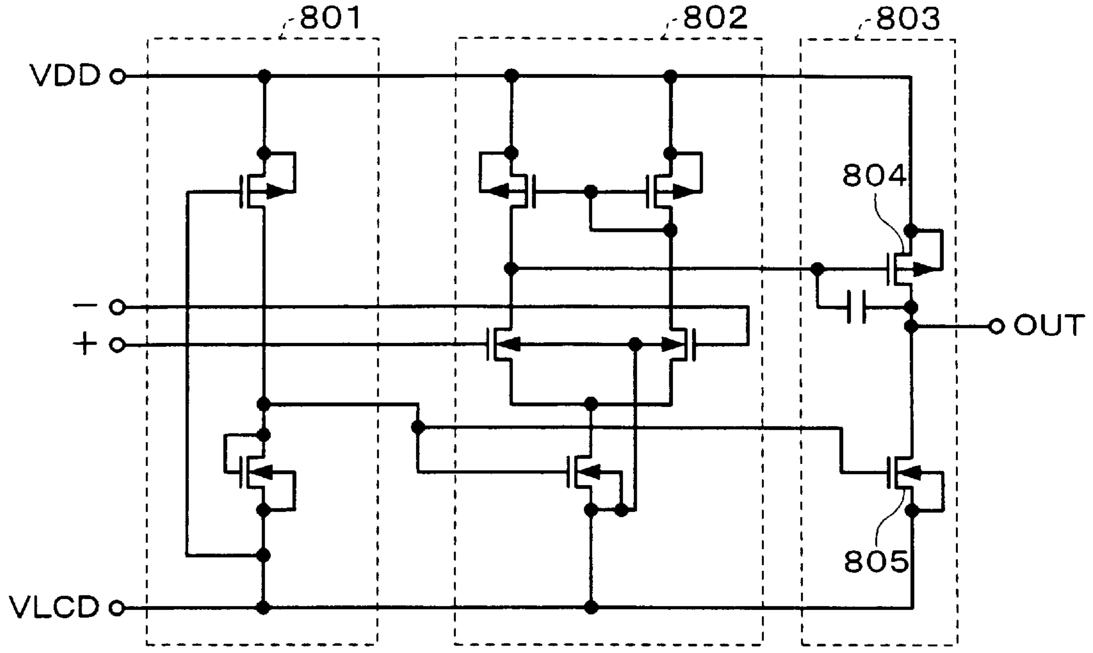
FIG. 8 PRIOR ART
FIG. 8 is a circuit diagram of the conventional first impedance conversion circuit shown in FIG. 7.
Figure 9:
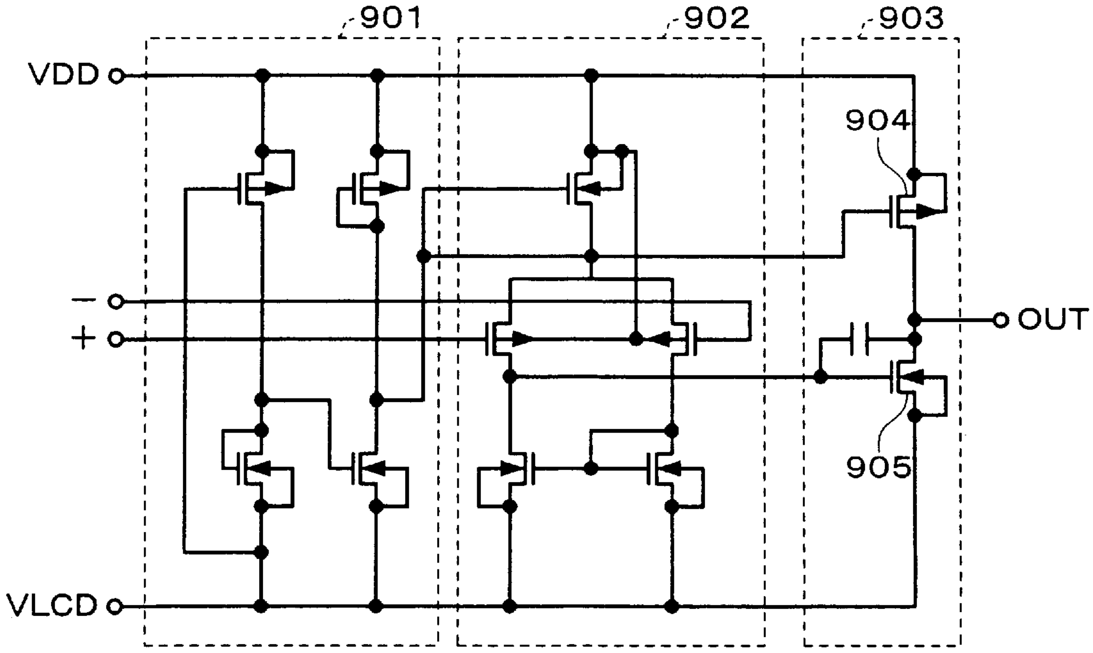
FIG. 9 PRIOR ART
FIG. 9 is a circuit diagram of the conventional second impedance conversion circuit shown in FIG. 7.

FIG. 6 is a circuit diagram showing another example of the second impedance conversion circuit 104 of FIG. 2. This second impedance conversion circuit 104 comprises a constant current circuit 601, P-type differential amplification circuit 602, N-type differential amplification circuit 603, and output circuit 604 similar to the impedance conversion circuit 400 of FIG. 4. Moreover, the output circuit 604 has the P-type transistor 605 and N-type transistor 606 similar to the impedance conversion circuit 400 of FIG. 4. The second impedance conversion circuit 104 differs from the circuit of FIG. 4 in that it has a P-type transistor 607 connected between the first power supply line 105 and the output terminal OUT. The output voltage of the constant current circuit 601 is applied to the gate of the P-type transistor 607. Note that the P-type transistor 607 is designed so that a constant current is allowed to flow only in an amount as small as possible.

Next, operation of the circuits shown in FIGS. 5 and 6 will be described with reference to FIGS. 11 and 12.

Figure 11:
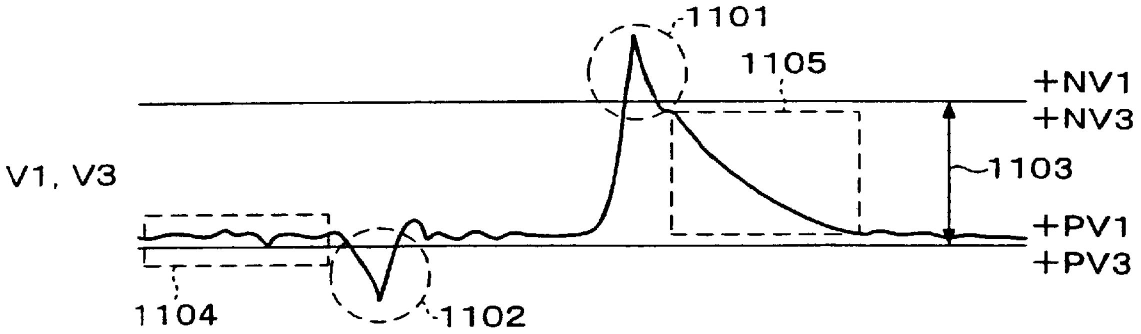
FIG. 11 is a waveform chart showing an output from the output terminal of the first impedance conversion circuit of FIG. 5.

FIG. 11 shows an output waveform from the output terminal OUT of the impedance conversion circuit 103 of FIG. 5.

In this figure, 1101 shows an operating period of the N-type transistor 506, 1102 shows an operating period of the P-type transistor 505, 1103 shows a non-operating period in which neither the P-type transistor 505 nor the N-type transistor 507 is actuated, 1104 shows an operating period (or a stable period) of the N-type transistor 507 used for a constant current, and 1105 shows an operating period (or a transitional period) of the N-type transistor 507 used for a constant current.

The basic operation of the first impedance conversion circuit 103 of FIG. 5 is similar to that of the impedance conversion circuit 400 of FIG. 4, except that the N-type transistor 507 of FIG. 5 is operated by the output from the constant current circuit 501. Specifically, the N-type transistor 507, which is designed so as to be operated at a constant current as small as possible, is operated during the period 1104 (off-period) in which neither the P-type transistor 505 nor the N-type transistor 506 is in operation. Therefore, the voltage at the output terminal OUT for the first impedance conversion circuit 103 is maintained at the voltage V1 or V3 that is shifted to the side of either the input voltage (+PV1) or the input voltage (+PV3) (the state of 1104 in FIG. 11).

Figure 13:
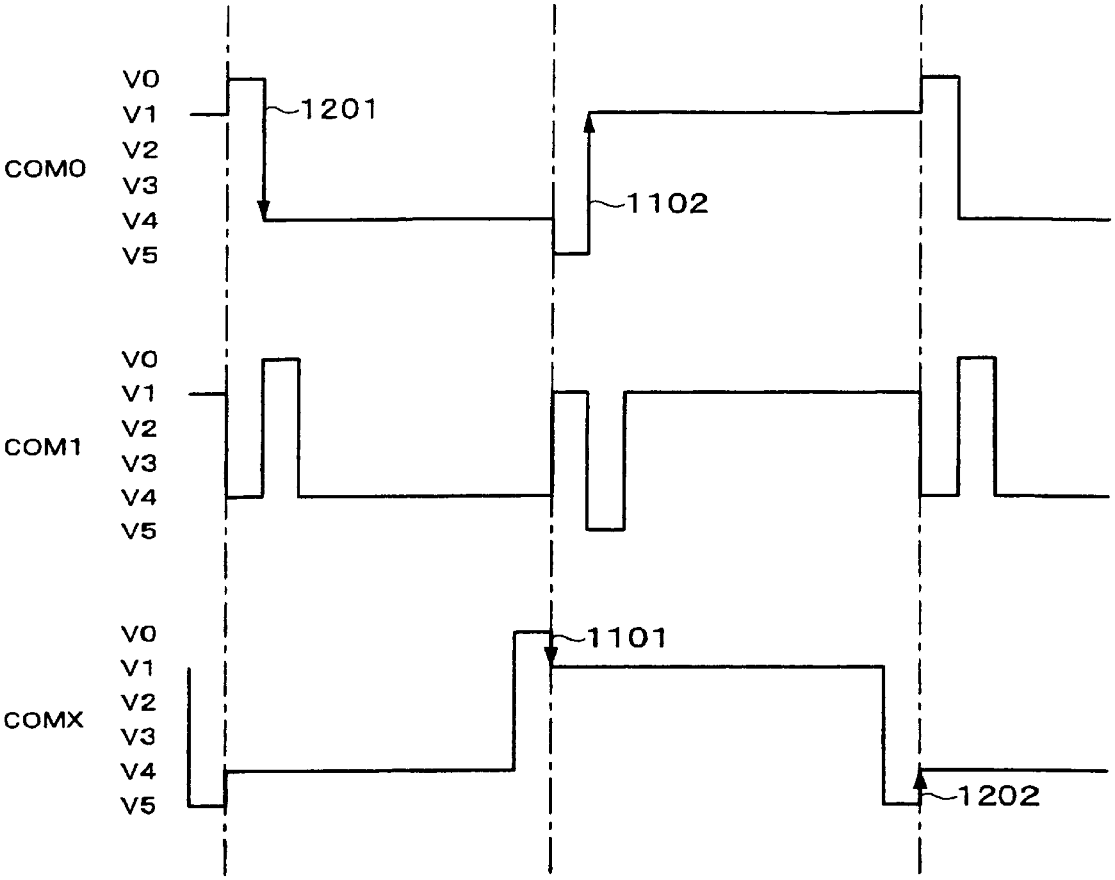
FIG. 13 is a waveform chart showing a liquid crystal driving waveform supplied to the scanning electrodes.
Figure 14:
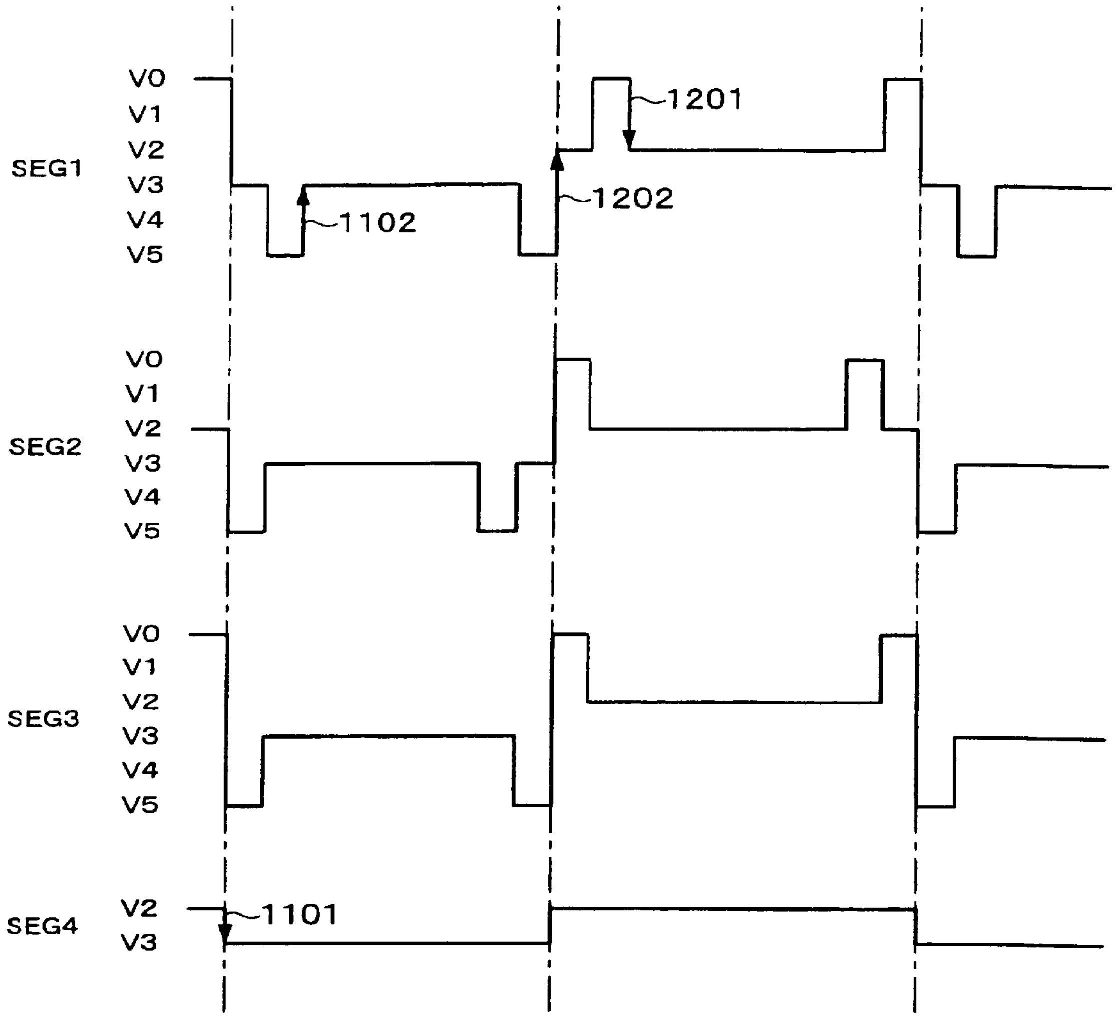
FIG. 14 is a waveform chart showing a liquid crystal driving waveform supplied to the signal electrodes.

The voltage at the output terminal OUT may increase from the voltage V1 or V3 to a level equal to or higher than the voltage (+NV1) or (+NV3) due to potential fluctuation at an electrode on the side of a liquid crystal panel to be driven (see 1101 in FIGS. 11, 13 and 14). In this case, since the voltage at the minus input terminal of the first impedance conversion circuit 103 increases, the output voltage of the N-type differential amplification circuit 503 also increases, and thus the N-type transistor 506 is turned on. As a result, the voltage at the output terminal OUT is decreased to a level equal to or lower than (+NV1) or (+NV3) (the state of 1101 in FIG. 11).

When the voltage at the output terminal OUT becomes equal to the voltage of the input voltage (+NV1) or (+NV3), the N-type transistor 506 is turned off. The voltage at the output terminal OUT further decreases by the operation of the N-type transistor 507, whereby the voltage converges to a voltage approximately equal to the input voltage (+PV1) or (+PV3) (the state of 1105 in FIG. 11).

By contrast, there may be the occasion where the voltage at the output terminal OUT decreases to a level equal to or lower than the voltage (+PV1) or (+PV3) due to potential fluctuation at an electrode on the side of a liquid crystal panel to be driven (see 1002 in FIGS. 11, 13 and 14). In this case, since the voltage at the minus input terminal of the first impedance conversion circuit 103 decreases, the output voltage of the P-type differential amplification circuit 502 also decreases, and thus the P-type transistor 505 is turned on. As a result, the voltage at the output terminal OUT is increased to a level equal to or higher than (+PV1) (the state of 1102 in FIG. 11).

When the voltage at the output terminal OUT becomes equal to the input voltage (+PV1) or (+PV3) of the +P terminal, the P-type transistor 505 is turned off. The voltage at the output terminal OUT is maintained at (+PV1) or (+PV3) by the operation of the N-type transistor 507 in the stable period.

Next, operation of the second impedance conversion circuit 104 of FIG. 6 will be described with reference to FIG. 12. The basic operation of the second impedance conversion circuit 104 of FIG. 6 is similar to that of the impedance conversion circuit 400 of FIG. 4, except that the P-type transistor 607 is operated by the output from the constant current circuit 601.

Figure 12:
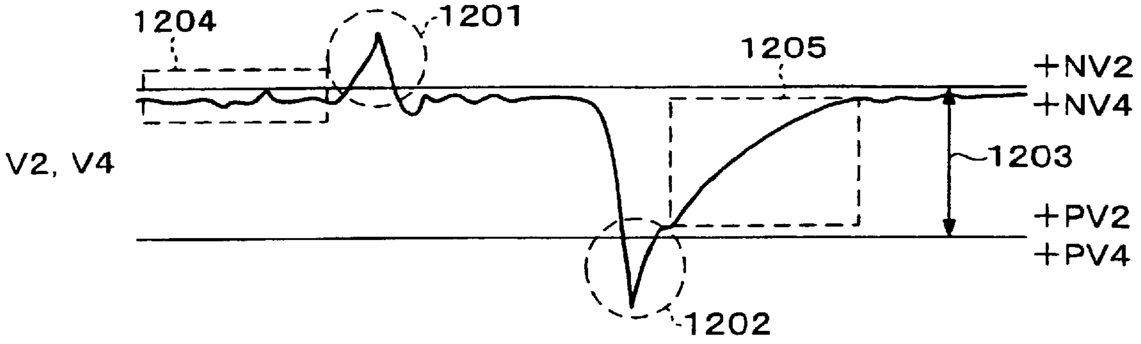
FIG. 12 is a waveform chart showing an output from the output terminal of the second impedance conversion circuit of FIG. 6.

The voltage at the output terminal OUT may increase from the voltage V2 or V4 (the state of 1204 in FIG. 12) to a level equal to or higher than the voltage (+NV2) or (+NV4) due to potential fluctuation at an electrode on the side of a liquid crystal panel to be driven (see 1201 in FIGS. 12, 13 and 14). In this case, since the voltage at the minus input terminal of the second impedance conversion circuit 104 increases, the output voltage of the N-type differential amplification circuit 603 also increases, and thus the N-type transistor 606 is turned on. As a result, the voltage at the output terminal OUT is decreased to a level equal to or lower than (+NV2) or (+NV4) (the state of 1201 in FIG. 12).

When the voltage at the output terminal OUT becomes equal to the input voltage (+NV2) or (+NV4), the N-type transistor 606 is turned off. Then, the voltage converges to a voltage approximately equal to the input voltage (+PV2) or (+PV4) by the operation of the P-type transistor 507.

By contrast, there may be the occasion where the voltage at the output terminal OUT decreases to a level equal to or lower than the voltage (+PV2) or (+PV4) due to potential fluctuation at an electrode on the side of a liquid crystal panel to be driven (see 1202 in FIGS. 12, 13 and 14). In this case, since the voltage at the minus input terminal of the second impedance conversion circuit 104 decreases, the output voltage of the P-type differential amplification circuit 602 also decreases, and thus the P-type transistor 605 is turned on. As a result, the voltage at the output terminal OUT is increased to a level equal to or higher than (+PV2) or (+PV4) (the state of 1202 in FIG. 12).

When the voltage at the output terminal OUT becomes equal to the input voltage (+PV2) or (+PV4) of the +P terminal, the P-type transistor 605 is turned off. The voltage at the output terminal OUT is further increased due to the operation of the P-type transistor 607. The voltage at the output terminal OUT is maintained at (+NV2) or (+NV4) by the operation of the P-type transistor 607 in the stable period.

In this manner, the first and second impedance conversion circuits 103 and 104 are operated according to the polarity of charges to be transferred from the impedance conversion circuit to an electrode which is an object to be driven.

(Still Other Examples of the First and Second Impedance Conversion Circuits)

The impedance conversion circuit 400 of FIG. 4 can be used as the first impedance conversion circuit 103 or the second impedance conversion circuit 104 of FIG. 1 by setting the input voltages to the +N terminal and the +P terminal as follows. The following voltage setting is also applicable to the first and second impedance conversion circuits 103, 104 of FIGS. 5 and 6.

Taking the case where a bias ratio for the voltage for driving liquid crystal is 1/5 as an example, the voltage in this case is set as follows.

Specifically, in the first impedance conversion circuit 103 of FIG. 1 which outputs the voltages V1 and V3, negative charges to be moved from the electrodes to be driven to the first impedance conversion circuits 103 is larger in amount than positive charges to be moved from the electrodes to be driven to the first impedance conversion circuits 103, as indicated by 1101 and 1102 in FIGS. 13 and 14. This is because the maximum amount of positive charges is equivalent to the potential difference between V0 and V1 or between V2 and V3 (difference of one level) as indicated by 1101, whereas the maximum amount of negative charges is equivalent to the potential difference between V5 and V1 (difference of four levels) as indicated by 1102. The voltage therefore is set so that the following expressions (11) to (14) are satisfied.

$$+PV1=V1 \tag{11}$$

$$+PV3=V3 \tag{12}$$

$$+NV1-V1>\text{VOFFSET} \tag{13}$$

$$+NV3-V3>\text{VOFFSET} \tag{14}$$

If the above conditions are satisfied, the voltage of the output terminal OUT for the first impedance conversion circuit 103 converges relatively promptly to the voltage V1 or V3 from the voltage equal to or lower than (+PV1) or (+PV3), thereby reducing the current consumption by the first impedance conversion circuit 103 during the converging process.

On the other hand, in the second impedance conversion circuit 104 of FIG. 1 which outputs the voltages V2 and V4, positive charges to be moved from electrodes to be driven to the second impedance conversion circuits 104 is larger in amount than negative charges to be moved from the electrodes to be driven to the second impedance conversion circuits 104, as indicated by 1201 and 1202 in FIGS. 13 and 14. This is because the maximum amount of negative charges is equivalent to the potential difference between V5 and V2 (difference of three levels) as indicated by 1202, whereas the maximum amount of positive charges is equivalent to the potential difference between V0 and V4 (difference of four levels) as indicated by 1201. The voltage therefore is set so that the following expressions (15) to (18) are satisfied.

$$+NV2=V2 \tag{15}$$

$$+NV4=V4 \tag{16}$$

$$+PV2-V2>\text{VOFFSET} \tag{17}$$

$$+PV4-V4>\text{VOFFSET} \tag{18}$$

If the above conditions are satisfied, the voltage at the output terminal OUT for the second impedance conversion circuit 104 converges relatively promptly to the voltage V2 or V4 from the voltage equal to or higher than (+NV1) or (+NV3), thereby reducing the current consumption by the second impedance conversion circuit 104 during the converging process.

Resistances in this case are shown by the above-described expressions (7) and (8), and the following expression (19).

$$R1+R2=R3=R4+R5+R6=R7=R8+R9=Rt/5 \tag{19}$$

(Liquid Crystal Device and Electronic Equipment)

Figure 19:
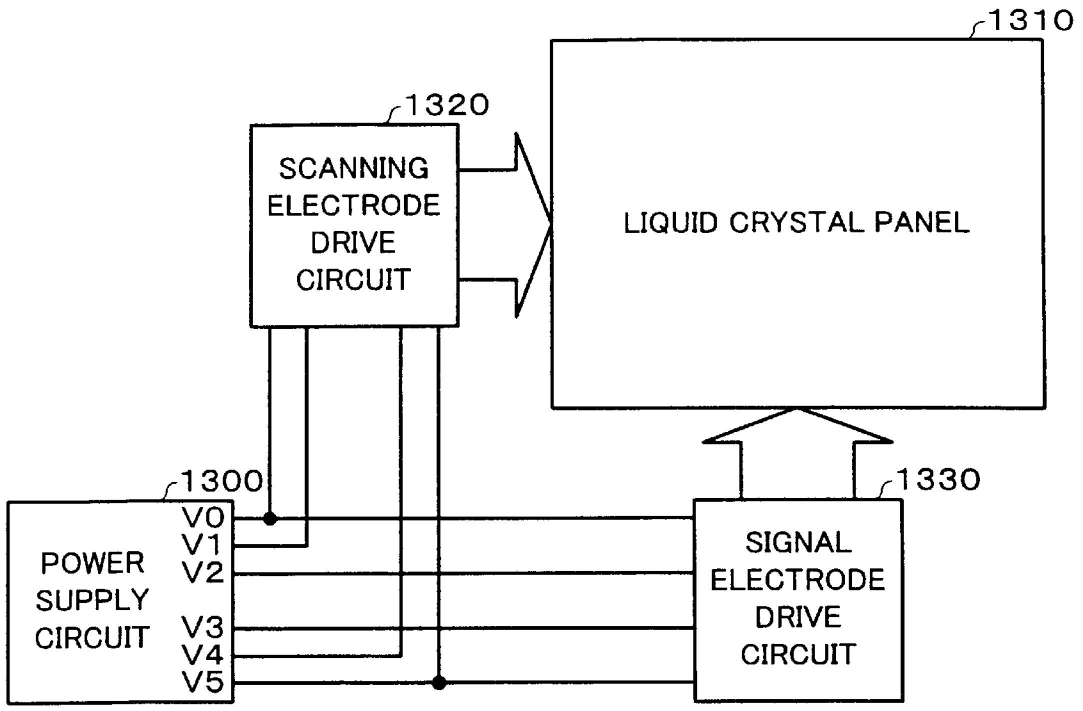
FIG. 19 is a block diagram of a liquid crystal device according to the embodiment of the present embodiment.

FIG. 19 shows a liquid crystal device using the power supply device for driving liquid crystal of the present invention. The liquid crystal device comprises a power supply device for driving liquid crystal 1300 having the structure of FIG. 1, a liquid crystal panel 1310 in which scanning electrodes and signal electrodes are formed, a scanning electrode drive circuit 1320 which drives the scanning electrodes based on power supply from the power supply device for driving liquid crystal 1300, and a signal electrode drive circuit 1330 which drives the signal electrodes based on the power supply from the power supply device for driving liquid crystal 1300, for example.

In the case of a simple matrix-type of liquid crystal device, a scanning electrode is called a common electrode and a signal electrode is called a segment electrode. It is needless to mention that the present invention is applicable to other drive systems such as an active matrix-type of liquid crystal device. Various kinds of electronic equipment using a liquid crystal device as a monitor, projectors using a liquid crystal device as a light bulb, and the like can be given as electronic equipment in which the liquid crystal device of the present invention is used. Due to the low power consumption, the liquid crystal device is particularly useful in various portable electronic instruments such as a portable telephone, a mobile computer, an electronic pocketbook, a game machine, and a video camera equipped with a liquid crystal view-finder and a digital camera.

What is claimed is:

1. A power supply device for driving liquid crystal that generates N numbers of liquid crystal drive voltages between first and second reference voltages, the power supply device comprising:

a voltage division circuit that divides a voltage between the first and second reference voltages to generate N pairs of first and second voltages including N numbers of first voltages each of which is equal to or higher than each of the N numbers of liquid crystal drive voltages, and N numbers of second voltages each of which is equal to or lower than each of the N numbers of liquid crystal drive voltages, when the first voltage is not equal to the second voltage in each pair; and N numbers of impedance conversion circuits that generate N numbers of impedance converted liquid crystal drive voltages based on the N pairs of the first and second voltages;

wherein each of the N numbers of impedance conversion circuits comprises:

a voltage follower type of differential amplification circuit to which a pair of first and second voltages among the N pairs of first and second voltages is input and which generates a first output voltage based on the first input voltage and further generates a second output voltage based on the second input voltage; and an output circuit including a P-type transistor and N-type transistor connected in series between a first power supply line for the first reference voltage and a second power supply line for the second reference voltage, and having an output terminal which is connected between the P-type transistor and N-type transistor and outputs one of the N numbers of liquid crystal drive voltages; and wherein the N-type transistor is turned on when an output voltage of the output terminal is higher than the first voltage, the p-type transistor is turned on when an output voltage of the output terminal is lower than the second voltage, and both the p-type and N-type transistors are turned off when an output voltage of the output terminal is between the first and second voltages.

2. The power supply device for driving liquid crystal as defined in claim 1, wherein current drive capabilities of the P-type and N-type transistors are substantially equivalent.

3. The power supply device for driving liquid crystal as defined in claim 1, wherein a potential difference between voltages of a pair of the first and second voltages is variable in the voltage division circuit.

4. The power supply device for driving liquid crystal as defined in claim 1, wherein a potential difference between voltages of a pair of first and second voltages is larger than an absolute value of an offset voltage between input and output voltages of the differential amplification circuit.

5. The power supply device for driving liquid crystal as defined in any one of claims 1 to 3, wherein the differential amplification circuit comprises:

an N-type voltage follower differential amplification circuit which receives the first voltage and applies the first output voltage to a gate of the N-type transistor; and a P-type voltage follower differential amplification circuit which receives the second voltage and applies the second output voltage to a gate of the P-type transistor.

6. The power supply device for driving liquid crystal as defined in claim 5, wherein a potential difference between voltages of a pair of the first and second voltages is larger than the sum of the absolute value of a first offset voltage between input and output voltages of the N-type differential amplification circuit and the absolute value of a second offset voltage between input and output voltages of the P-type differential amplification circuit.

7. The power supply device for driving liquid crystal as defined in claim 5, wherein at least one of the N impedance conversion circuits is connected between the output terminal and the second power supply line in parallel with the N-type transistor, and further comprises another N-type transistor for a constant current having a gate to which a constant bias voltage is applied.

8. The power supply device for driving liquid crystal as defined in claim 7, wherein at least another one of the N impedance conversion circuits is connected between the first power supply line and the output terminal in parallel with the P-type transistor, and further comprises another P-type transistor for a constant current having a gate to which a constant bias voltage is applied.

9. The power supply device for driving liquid crystal as defined in claim 5, wherein at least one of the N numbers of impedance conversion circuits has the first voltage among a pair of first and second voltages set substantially equivalent to one of the N numbers of liquid crystal drive voltages.

10. The power supply device for driving liquid crystal as defined in claim 9, wherein at least another one of the N numbers of impedance conversion circuits has the second voltage among a pair of the first and second voltages set substantially equivalent to another one of the N numbers of liquid crystal drive voltages.

11. A liquid crystal device comprising:

the power supply device for driving liquid crystal as defined in claim 1;

a liquid crystal panel in which scanning electrodes and signal electrodes are formed;

a scanning electrode drive circuit that drives the scanning electrodes based on power supply from the power supply device for driving liquid crystal; and a signal electrode drive circuit that drives the signal electrodes based on the power supply from the power supply device for driving liquid crystal.

12. Electronic equipment comprising the liquid crystal device as defined in claim 11.

* * * * *

UNITED STATES PATENT AND TRADEMARK OFFICE

CERTIFICATE OF CORRECTION

PATENT NO. : 6,476,591 B1
DATED : November 5, 2002
INVENTOR(S) : Hisashi Yamaguchi et al.

It is certified that error appears in the above-identified patent and that said Letters Patent is hereby corrected as shown below:

Title page,
Item [63], Foreign Application Priority Data, please insert as follows:
-- JP 11-2912 01/08/1999 --

Signed and Sealed this

Seventeenth Day of May, 2005

JON W. DUDAS
*Director of the United States Patent and Trademark Office*